United States Patent [19]
Dhong et al.

[11] Patent Number: 5,280,452
[45] Date of Patent: Jan. 18, 1994

[54] POWER SAVING SEMSING CIRCUITS FOR DYNAMIC RANDOM ACCESS MEMORY

[75] Inventors: Sang H. Dhong, Mahopac; Lewis M. Terman, South Salem, both of N.Y.

[73] Assignee: International Business Machines Corporation, Armonk, N.Y.

[21] Appl. No.: 729,120

[22] Filed: Jul. 12, 1991

[51] Int. Cl.$^5$ .................. G11C 7/00; G11C 11/40
[52] U.S. Cl. .................. 365/205; 365/208; 365/227
[58] Field of Search ............ 365/203, 205, 207, 208, 365/233, 227

[56] References Cited

U.S. PATENT DOCUMENTS

| | | | |
|---|---|---|---|
| 4,387,449 | 6/1983 | Masuda | 365/227 |
| 4,405,996 | 9/1983 | Stewart | 365/203 |
| 4,409,679 | 10/1983 | Kurafuji et al. | 365/227 |
| 4,528,646 | 7/1985 | Ochii et al. | 365/203 |
| 4,561,070 | 12/1985 | Armstrong | 365/226 |
| 4,570,243 | 2/1986 | Sud et al. | 365/227 |
| 4,616,342 | 10/1986 | Miyamoto | 365/190 |
| 4,751,683 | 6/1988 | Wada et al. | 365/230 |
| 4,760,562 | 7/1988 | Ohtani | 365/227 |
| 4,792,922 | 12/1988 | Mimoto et al. | 365/205 X |
| 4,816,706 | 3/1989 | Dhony et al. | 365/208 X |
| 5,010,523 | 4/1991 | Yamauchi | 365/205 |
| 5,134,588 | 7/1992 | Kubota et al. | 365/207 |

FOREIGN PATENT DOCUMENTS 0255591 11/1986 Japan ..................... 365/203

Primary Examiner—Robert J. Pascal
Assistant Examiner—Seung Ham
Attorney, Agent, or Firm—Philip J. Feig

[57] ABSTRACT

A sensing circuit for a dynamic random access memory structure is disclosed having first and second bit lines, one of the bit lines being a reference bit line which is held at a precharge voltage when a sense amplifier in the sensing circuit is latched, the sense amplifier includes first and second nodes and first, second, third and fourth transistor devices, the first and second transistor devices form an N-device cross-coupled pair and the third and fourth transistor devices form a P-device cross-coupled pair. The first node is connected to the first bit line and to the second and fourth transistor devices, and the second node is connected to the first and third transistor devices. A first isolation transistor device is connected to the first bit line and a second isolation transistor device is connected to the second bit line. A first clock signal line is connected to the first isolation transistor device and a second clock signal line is connected to the second isolation transistor device. A first equalization transistor device is connected to the first bit line and a second equalization transistor device is connected to the second bit line, a voltage signal line having a voltage value $V_{EQ}$ thereon is connected to the first and second equalization transistor devices, and a third clock signal line is connected to the first equalization device. A fourth clock signal line is connected to the second equalization transistor device, a fifth clock signal line is connected to the first and second N devices, a sixth clock signal line is connected to the third and fourth P devices. The first, second, third, fourth and fifth and sixth clock signal lines have clock signals thereon which occur during a time sequence for precharging the first and second nodes to a precharge voltage value $V_{EQ}$.

5 Claims, 2 Drawing Sheets

POWER SAVING SEMSING CIRCUITS FOR DYNAMIC RANDOM ACCESS MEMORY

BACKGROUND OF THE INVENTION

1. Field of the Invention

The present invention relates to dynamic random access storage memory circuits, and more particularly to improved precharge and input/output operation for power savings in random access memories.

2. Description of the Prior Art

U.S. Pat. No. 4,387,449 issued Jan. 7, 1983 to Masuda, entitled PROGRAMMABLE MEMORY DEVICE HAVING REDUCED POWER CONSUMPTION UPON UNSELECTION, discloses a memory device capable of operating in a power down mode in which peripheral memory circuitry is inactivated, the power down mode being assumed in response to an unselect signal at any one of a plurality of chip enable terminals. In response to a write potential at the output terminal of the memory, a detector circuit will leave the output circuit inactivated but will activate any peripheral circuitry necessary for the write operation.

U.S. Pat. No. 4,405,996 issued Sep. 20, 1983 to Stewart, entitled PRECHARGE WITH POWER CONSERVATION, describes a circuit having a "selected" and a "deselected" state and a controllable pulse generating network which is operable when the circuit is "selected". The latch senses and stores a signal evidencing a change of state of any one of certain input signals to the circuit when the circuit deselected. The pulse network is responsive to the stored signal and produces a pulse, indicative of the occurrence of a change when the circuit is subsequently selected.

U.S. Pat. No. 4,409,679 issued Oct. 11, 1983 to Kurafuji et al, entitled STATIC MEMORY CIRCUIT, discloses a static memory circuit incorporating memory cells of a MOS static type comprising a plurality of potential setting circuits for setting the ground side potential of one selected memory cell to be lower than those of other non-selected memory cells. Thus, reducing power dissipation by reducing current flowing through half-selected and non-selected memory cells without reducing read speed.

U.S. Pat. No. 4,528,646 issued Jul. 9, 1985 to Ochii et al, entitled SEMICONDUCTOR MEMORY WITH SELECTIVELY ENABLED PRECHARGE AND SENSE AMPLIFIER CIRCUITS, discloses bit line precharge circuits, sense AMP circuits and input-output line precharge circuits which are respectively divided into two groups by select circuits which are controlled by a select control signal. Only the selected precharge circuits and the sense AMP circuits are enabled before a readout operation. The peak current for precharging bit lines is reduced to one-half as compared to conventional circuits due to the decrease of stray capacitance to be precharged.

U.S. Pat. No. 4,561,070 issued Dec. 24, 1985 to Armstrong, entitled INTEGRATED CIRCUIT MEMORY, discloses an integrated circuit memory wherein an array of memory elements is addressed by a decoder circuit responding to an address signal. The decoder circuit includes a plurality of sections, each one thereof being used to address a different section of the array. A decoder section selector is provided which, in response to the addressing signal, determines the section of the array being addressed and electrically couples the one of the plurality of decoder circuit sections which is coupled to such addressed array section to a power source while electrically decoupling the remaining section of the decoder circuit from such power source. With such arrangement, only a portion of the decoder circuit is electrically coupled to the power source when addressing the array thereby reducing the power consumption of the integrated circuit memory.

U.S. Pat. 4,570,243 issued Feb. 11, 1986 to Sud et al, entitled LOW POWER I/O SCHEME FOR SEMICONDUCTOR MEMORIES, describes a low power I/O scheme which is particularly useful in wide word semiconductor memories which include redundant memory cells as well as regular memory cells. Conventional load transistors for a main data bus are turned off during all write operations to conserve power. In addition, predata lines which carry data between memory cells and the main data bus include load transistors that are turned off during normal read or write operations to conserve additional power, and turned on during spare read or write operations to preserve the stability of unselected regular cells. The predata lines are held above ground potential during read or write operations to prevent conduction of deselected column select transistors.

U.S. Pat. No. 4,616,342 issued Oct. 7, 1986 to Miyamoto, entitled SEMICONDUCTOR MEMORY DEVICE, discloses a semiconductor memory device that comprises word lines connected to a row of memory cells, pairs of bit lines each connected to a different column of memory cells, word line drive means for driving the word line, and data sensing means. The word line drive means drives a selected word line only during a predetermined time duration which is shorter than the time duration of a word selection signal. The data sensing means includes a differential amplifier including a pair of bipolar transistors connected at their base electrodes to a pair of bit lines. Within the predetermined shorter time period, the differential amplifier senses the data stored in a selected memory cell and that sensed data is latched by a latching circuit.

U.S. Pat. No. 4,751,683 issued Jan. 14, 1988 to Wada et al, entitled STATIC SEMICONDUCTOR MEMORY DEVICE COMPRISING WORD LINES EACH OPERATING AT THREE DIFFERENT VOLTAGE LEVELS, describes a semiconductor memory device that operates in response to an address transition detection (ATD) signal for detecting a change in an x address as well as to a write enable signal WE to make the signal on a selected word line vary according to the read mode and the write mode, whereby dissipation of electric power can be reduced.

U.S. Pat. No. 4,760,562 issued Jul. 26, 1988 to Ohtani, entitled MOS STATIC MEMORY CIRCUIT, discloses voltage converters arranged in units of columns in a memory device. Each voltage converter is connected to a column decoder. The column decoder receives a column address signal and supplies a column selection signal to the voltage converter. The voltage converters apply a ground level voltage to the source junctions of the drive transistor pairs of the memory cells of the selected columns, and a voltage higher than the ground level voltage to the source junctions of the drive transistor pairs of the memory cells of the non-selected columns so as to decrease power consumption in the non-selected columns as compared with that in the selected columns.

SUMMARY OF THE INVENTION

An object of the present invention is to provide new power-saving sensing circuits for DRAM structures.

A further object of the present invention is to provide circuits for DRAM structures wherein the reference bit line of a bit line pair is held at the precharge voltage during sense amplifier latching and subsequent I/O activities.

Still another object of the present invention is to provide a DRAM circuit wherein only the bit line with the activated cell undergoes a voltage swing, reducing power dissipation and decreasing di/dt during normal access and refresh cycles. The bit line of the bit line pair with the activated cell connected swings according to the content of the cell during a read and to the data forced on the I/O line during writing, while the other bit line of the bit line pair is kept at a reference voltage.

DESCRIPTION OF THE PREFERRED EMBODIMENTS

State-of-the-art increases in DRAM circuit density has produced an interest in very large solid-state memory systems with battery back-up for non-volatility. Reducing DRAM power consumption during refresh cycles is of utmost concern for these applications, especially for the period when the DRAM is powered by a battery. In conventional DRAMs, a cell is refreshed by first reading out the state of the cell into the sense amplifier, and then writing the state back into the cell. Using, for example, $V_{DD}/2$ sensing, both bit lines in a bit line pair are precharged to $V_{DD}/2$, and when the cell is sensed and rewritten, one bit line of the pair undergoes a voltage swing to ground, and the other undergoes a swing to $V_{DD}$. The bit lines are then restored back to $V_{DD}/2$ during precharge. In this sequence, both bit lines dissipate a.c. energy given by $$E = C_{BL}(V_{DD}/2)^2$$

where $C_{BL}$ is the bit line capacitance, and $V_{DD}$ is the supply voltage. Thus, refresh of a DRAM memory cell results in energy dissipation on both bit lines.

The present invention provides a novel sensing scheme where the refresh energy is reduced by holding the reference bit line of a bit line pair at the bit line precharge voltage during sense amplifier latching and subsequent rewrite into one cell. Sensing/rewrite and writing operations of the cell are not affected, since the reference bit line does not need to undergo a voltage swing for the sensing/rewrite and write operations. Thus, the a.c. energy dissipated by the voltage swing on the reference bit line in conventional refresh, read and write operations is eliminated.

Figure 1:
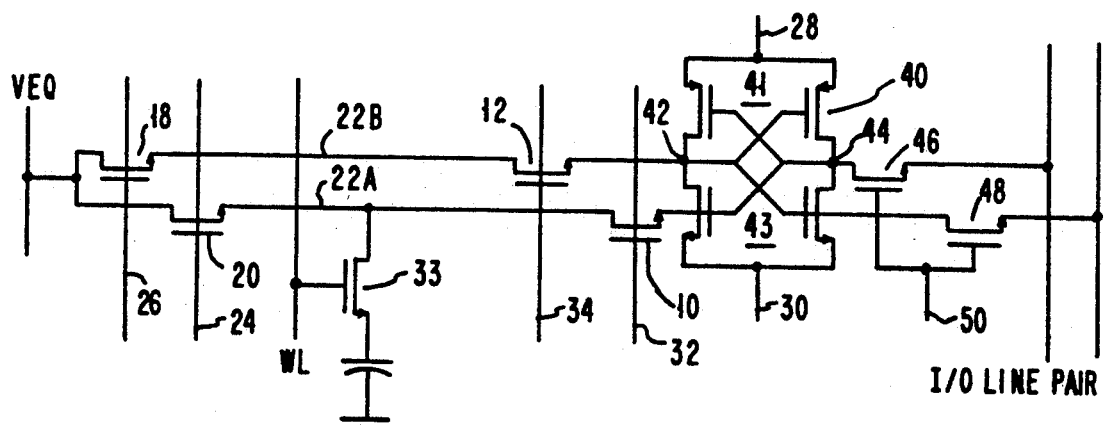
FIG. 1 is a schematic block diagram of an embodiment of a DRAM circuit illustrating the principles of the present invention.

FIG. 1 illustrates a schematic diagram of an embodiment of the invention. The circuit of FIG. 1 is unique compared with prior art sensing schemes. Two major differences are that the bit line isolation devices 10 and 12 are controlled separately by clock signals on lines 32 and 34, respectively, and the equalization devices 18 and 20, which precharge the bit line pair 22A and 22B, are controlled separately by clock signals on lines 26 and 24, respectively. By the addition of the separately controlled isolation devices 10, 12 and equalization devices 18, 20, proper sensing and restoration of the cell charge is obtained even though only one bit line undergoes a voltage swing.

In FIG. 1, the high voltage level on the clock lines 32 and 34 connected to the gates of devices 10 and 12, respectively, must be higher than the highest level of sense amplifier signal on line 28 at least by the threshold voltage $V_{IN}$ of device 10 and device 12 in order to restore the full high signal on line 28 to the cell.

Figure 2:
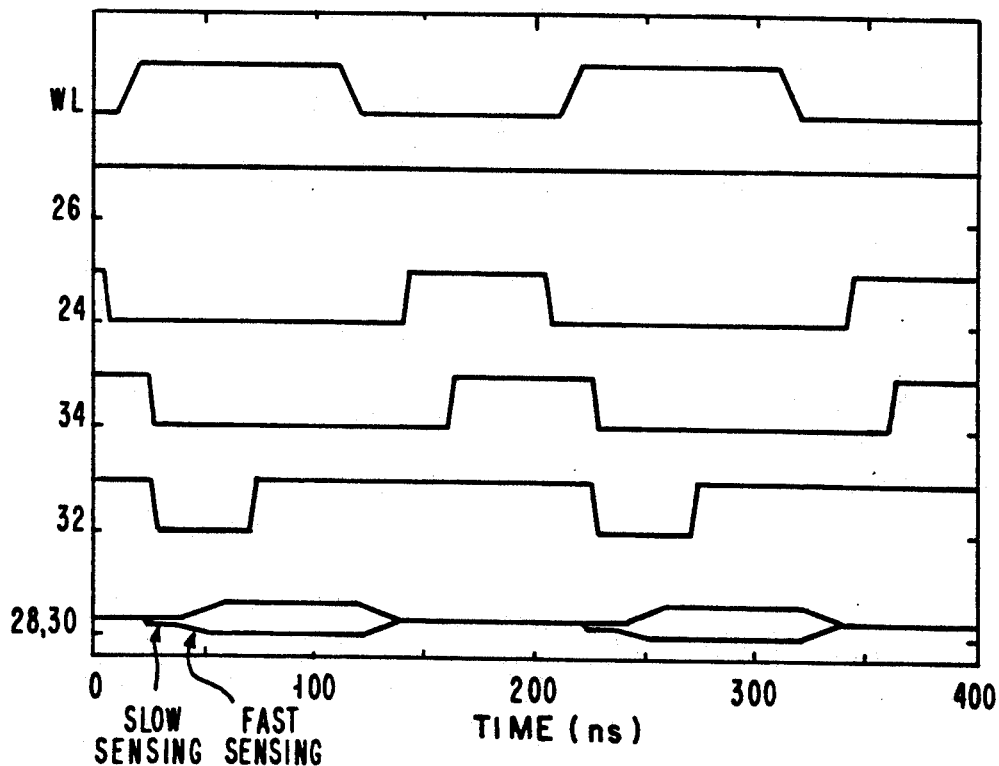
FIG. 2 is a schematic timing diagram illustrating the signal waveforms during the operation of the DRAM circuit of FIG. 1.

FIG. 2 shows the timing diagram for proper operation of the circuit shown in FIG. 1. Two cycles are shown with a cycle time of 200 ns, which is typical for current generation DRAMs.

In the operation of FIG. 1, the clock signals on lines 24 and 26 at the beginning of a refresh cycle are initially high, turning on devices 18 and 20, and the bit line pair 22A, 22B is precharged to the precharge voltage $V_{EQ}$. Voltage levels on lines 32 and 34 are high and the bit line pair 22A and 22B is electrically connected to the sense amplifier 40. Lines 28 and 30 are connected to clocks at the same precharge voltage level, turning off all the devices in the sense amplifier 40 and the sense amplifier nodes 42 and 44 are at precharge voltage $V_{EQ}$. Clock 50 line level is low, turning off I/O line pair devices 46 and 48. The pair is not activated during a refresh. It is assumed that the precharge voltage is at the average of the highest level of the signal on line 28 and the lowest level of the signal on line 30, which is typically at $\frac{1}{2} V_{DD}$, although other levels are possible without altering the operation of the circuit. More particularly, in the present embodiment, the signal on line 30 changes between $\frac{1}{2} V_{DD}$ and ground, and the signal on line 28 changes between $\frac{1}{2} V_{DD}$ and $V_{DD}$. When a refresh cycle is activated, the bit line in the bit line pair 22A and 22B which is connected to the cell to be refreshed (e.g., bit line 22A) is disconnected from $V_{EQ}$ by bringing the voltage on line 24 low, turning off device 20. Bit line 22B remains connected to $V_{EQ}$ through device 18. As the selected word line is activated, 28 in this case, the bit line 22A and the corresponding node 44 of sense amplifier 40 move due to the charge transfer to or from the selected cell 33, creating a differential signal between nodes 42 and 44. After sufficient differential signal development on bit line 22A, lines 32 and 34 are pulled down, turning devices 10 and 12 off. This isolates the sense amplifier 40 from the bit line pair 22A, 22B. Setting of the sense amplifier 40 starts with slow sensing, which starts with pulling the signal on line 30 down by a small amount as shown in FIG. 2. The timing between the slow-sensing signal on lines 32 and 34 is not limited to the sequence shown in the figure. As long as the drop of signals on lines 32 and 34 allows adequate bit line signal development, lines 32 and 34 can drop any time before the start of the slow-sensing, because it is necessary to disconnect the sense amplifier 40 from the bit lines 22A, 22B before setting of the sense amplifier 40, which includes P-device cross-coupled pair 41 and N-device cross-coupled pair 43, is initiated.

Sense amplifier 40 latching continues further by activating the signal on line 28 to $V_{DD}$ and bringing the signal on line 30 to ground to initiate fast sensing. After sense amplifier 40 is completely latched, one of the sense amplifier nodes 42 and 44 is at $V_{DD}$ and the other is at ground. The signal on line 32 is then pulled up, turning device 10 on. The voltage on bit line 22A moves accordingly and the full "1" or "0" signal level is rewritten back into cell 33. The selected word line is then returned to a low level, deselecting cell 33, and clock lines 24, 26 are raised high turning on equalization devices 10 and 20, and clock 28 and 30 return to $V_{EQ}$ for the precharge condition.

Figure 3:
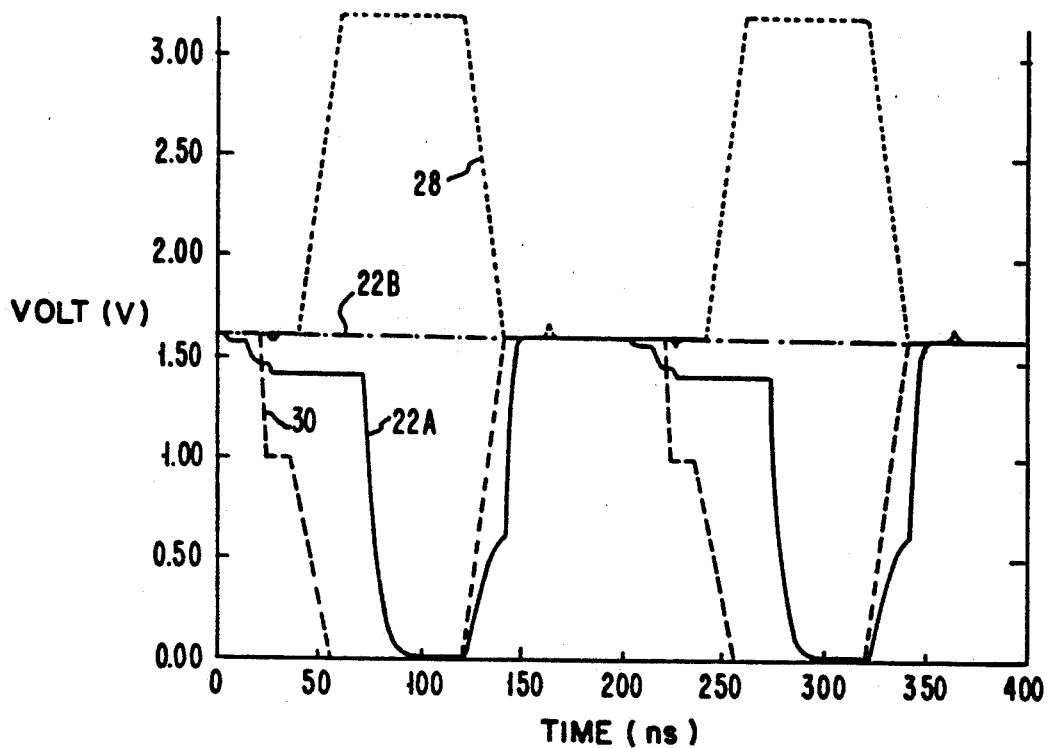
FIG. 3 is a schematic timing diagram showing further waveforms in more detail for the operation of the circuit of FIG. 1.

FIG. 3 shows in more detail the waveforms of the signals on bit line pairs 22A, 22B, and lines 28 and 30. It should be noted that only the voltage on bit line 22A moves while bit line 22B stays at the precharge voltage. After the bit line swing, the word line is reset to ground for an NMOS array. The signals on lines 28 and 30 return to their original levels. The signal on line 24 is turned on and the bit line 22A is precharged for the next cycle. The signal on line 34 is turned on and the internal nodes 28 and 30 of sense amplifier 40 are precharged to $V_{EQ}$.

Figure 4:
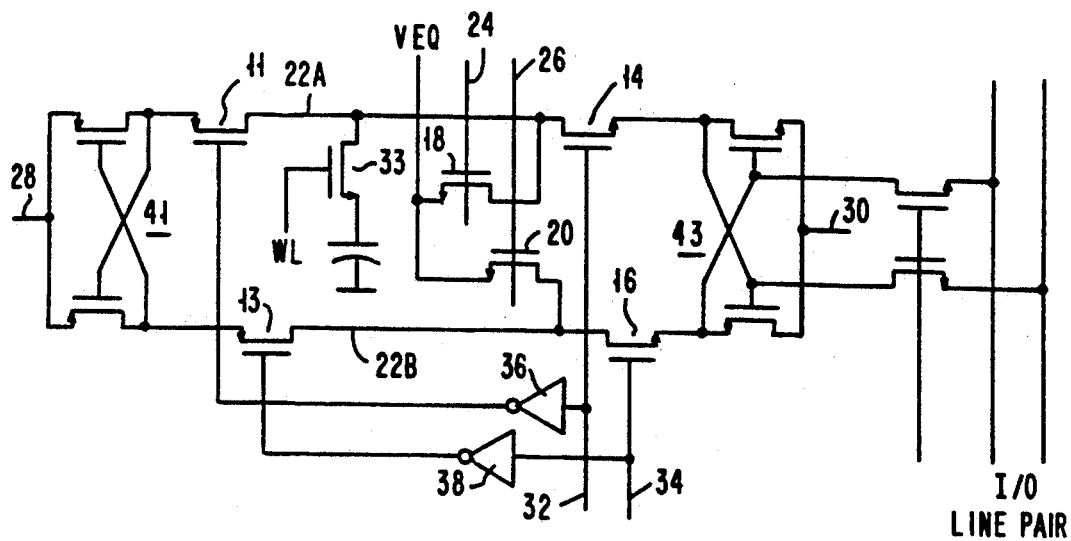
FIG. 4 is a schematic diagram of another embodiment of a DRAM circuit illustrating the principles of the present invention.

Referring to FIG. 4, the basic difference between the structures of FIG. 1 and FIG. 4 is the location of bit line isolation devices. As previously stated in FIG. 1, the high voltage levels on the clock lines 32 and 34 connected to the gates of devices 10 and 12 must be higher than the highest level of sense amplifier signal on line 28 at least by the threshold voltage $V_{TN}$ of device 10 and device 12 in order to restore the full signal on line 28 to the cell.

In FIG. 4, the bit line pair 22A and 22B is placed between n isolating device pairs 14 and 16 and p isolating device pairs 11 and 13. The devices 10 and 12 are eliminated. Also, the p cross-coupled pair 41 connected to line 28 and the n cross-coupled pair 43 connected to line 30 are separated from each other. In this configuration, clock signals 32, 34 and the signal on 28 may have the same high voltage level, and the signal on 30 and clock signals 32, 34 can have the same low voltage.

Having thus described our invention what we claim as new and desire to secure as Letters Patent, is:

1. A sensing circuit for a dynamic random access memory structure comprising:
    first and second bit lines;
    a sense amplifier including first and second nodes and first, second, third and fourth transistor devices, said first and second transistor devices forming an N-device cross-coupled pair and said third and fourth transistor devices forming a P-device cross-coupled pair, wherein said first node is connected to said first bit line and to said second and fourth transistor devices, and said second node is connected to said second bit line and said first and third transistor devices;
    a first isolation transistor device connected to said first bit line and a second isolation transistor device connected to said second bit line;
    a first clock signal line connected to said first isolation transistor device and a second clock signal line connected to said second isolation transistor device;
    a first equalization transistor device connected to said first bit line and a second equalization transistor device is connected to said second bit line;
    a voltage signal line having a precharge voltage value $V_{EQ}$ thereon connected to said first and second equalization transistor devices;
    a third clock signal line connected to said first equalization transistor device;
    a fourth clock signal line connected to said second equalization transistor device;
    a fifth clock signal line connected to said first and second N devices;
    a sixth clock signal line connected to said third and fourth P devices;
    said first, second, third, fourth and fifth and sixth clock signal lines being characterized in having clock signals thereon which occur during a time sequence for precharging said first and second nodes to said precharge voltage value $V_{EQ}$,
    wherein said sense amplifier is sensed and rewritten by signals occurring in sequence on said fifth and sixth clock signal lines, and
    wherein said first and second equalization devices and said clock signals on said third and fourth clock signal lines function to maintain one of said first and second bit lines at a constant voltage level.

2. A sensing circuit for a dynamic random access memory structure according to claim 1 wherein said precharge voltage value $V_{EQ}$ is substantially equal to $\frac{1}{2} V_{DD}$ where $V_{DD}$ is the system voltage supply value.

3. A sensing circuit for a dynamic random access memory structure according to claim 1 wherein said clock signal on one of said third and fourth clock signal lines turns off said one of said first and second equalization transistor devices connected thereto to disconnect one of said first and second bit lines connected thereto from said voltage signal line having said $V_{EQ}$ voltage value thereon,
    said clock signal on said other one of said third and fourth clock signal lines maintains said other one of said first and second equalization transistor devices on to keep said other one of said first and second bit lines connected to said voltage line having said $V_{EQ}$ voltage value thereon to maintain said other one of said first and second bit lines at said constant voltage level.

4. A sensing circuit for a dynamic random access memory structure according to claim 1 further including a memory word line connected to an access transistor device, said access transistor device also being connected between a memory cell capacitor and one of said first and second bit lines,
    wherein a signal on said word line turns on said access transistor device to thereby connect said cell capacitor to charge the voltage level in said one of said first and second bit lines, causing said associated one of said first and second nodes to change voltage level value and produce a voltage level difference between said first and second nodes.

5. A sensing circuit for a dynamic random access memory structure according to claim 4 wherein said voltage signal levels on said first and second clock signal lines decrease and turn said first and second isolation transistor off, thereby isolating said first and second bit lines from said sense amplifier.

* * * * *